United States Patent [19]
Nakazawa

[11] Patent Number: 5,561,075
[45] Date of Patent: Oct. 1, 1996

[54] METHOD OF MANUFACTURING AN ACTIVE MATRIX PANEL

[75] Inventor: Takashi Nakazawa, Suwa, Japan

[73] Assignee: Seiko Epson Corporation, Tokyo, Japan

[21] Appl. No.: 439,180

[22] Filed: May 9, 1995

Related U.S. Application Data

[62] Division of Ser. No. 378,906, Jan. 26, 1995, which is a continuation of Ser. No. 880,120, May 7, 1992, abandoned.

[30] Foreign Application Priority Data

| | | | |
|---|---|---|---|
| May 8, 1991 | [JP] | Japan | 3-102668 |
| Oct. 17, 1991 | [JP] | Japan | 3-269675 |

[51] Int. Cl.$^6$ .............................................. H01L 21/786
[52] U.S. Cl. .................. 437/41; 437/174; 437/237; 437/44; 437/983; 257/72
[58] Field of Search ...................... 437/983, 236, 437/237, 979, 44, 21, 101, 909, 40 TFT, 41 TFT, 173, 174, 49; 257/59, 61, 66, 69, 72, 900; 148/DIG. 90

[56] References Cited

U.S. PATENT DOCUMENTS

| | | | |
|---|---|---|---|
| 4,469,568 | 9/1984 | Kato et al. | |
| 4,727,044 | 2/1988 | Yamazaki | 437/101 |
| 5,165,075 | 11/1992 | Hiroki et al. | 359/59 |
| 5,289,030 | 2/1994 | Yamazaki et al. | |
| 5,474,942 | 12/1995 | Kodaira et al. | 437/21 |

FOREIGN PATENT DOCUMENTS

| | | | |
|---|---|---|---|
| 55-024420 | 2/1980 | Japan | |
| 57-087175 | 5/1982 | Japan | |
| 58-115864 | 7/1983 | Japan | |
| 61-105873 | 5/1986 | Japan | |
| 61-147574 | 7/1986 | Japan | |
| 61-156885 | 7/1986 | Japan | |
| 61-185724 | 8/1986 | Japan | |
| 61-252667 | 11/1986 | Japan | 437/21 |
| 63-178560 | 7/1988 | Japan | |
| 1-185522 | 7/1989 | Japan | |
| 1-183853 | 7/1989 | Japan | |
| 2-85826 | 3/1990 | Japan | |
| 2-90683 | 3/1990 | Japan | |
| 2-148831 | 6/1990 | Japan | |
| 2-306664 | 12/1990 | Japan | |
| 2-307273 | 12/1990 | Japan | |
| 3-108319 | 5/1991 | Japan | 437 TFT/40 TFT |

OTHER PUBLICATIONS

S. Wolf & R. N. Tauber, "Silicon Processing For the VLSI Era" vol. I, 1986, pp. 177–180, 198, 187–188, 335.
Translation of JP 61-147574 (Imashiro).
S. Morozumi, et al., R&D Department, Seiko Epson Corporation, Negano, "5.2 Low Temperature Processed Poly Si TFT and its Application to Large Area LCD", Japan Display '86, pp. 196 to 199.

(List continued on next page.)

*Primary Examiner*—Tom Thomas
*Assistant Examiner*—Leon Radomsky

[57] ABSTRACT

In the formation and structure of a thin film transistor (TFT), an insulator is formed to cover the surface of the transistor gate electrode, which electrode is separated from an underlying semiconductor layer, having defined source, drain and channel regions, by a gate insulating layer. The overlying gate insulator is formed by anodic oxidation of the gate electrode metal. The formation of the gate insulator thickness and its offset, lateral $\Delta L$, which is defined as the lateral spatial separation between the gate electrode and the source or drain region, can be accurately controlled by the gate electrode anodic oxidation process to provide a reliably and reproducible low OFF current, $I_{OFF}$, resulting in a TFT that provides for a large $I_{ON}/I_{OFF}$ ratio useful in large area applications wherein electrical charge is required, such as, liquid crystal displays and memory integrated circuits. Preferably, the metal gate electrode is subjected to anodic oxidation at a voltage within the range of between approximately 150 V to 250 V achieving a lateral offset, $\Delta L$, in the range of approximately 100 nm to 200 nm.

19 Claims, 7 Drawing Sheets

OTHER PUBLICATIONS

K. Nakazawa et al., "Lightly Doped Drain TFT Structure for Poly–Si LCDs", SID '90 Digest, pp. 311–314.

"Enhanced Adhesion To Glass Substrates Using Tantalum Oxide Adhesion Layer", *Research Disclosure*, No. 325, May 1991, Havant GB, p. 369, XP229725.

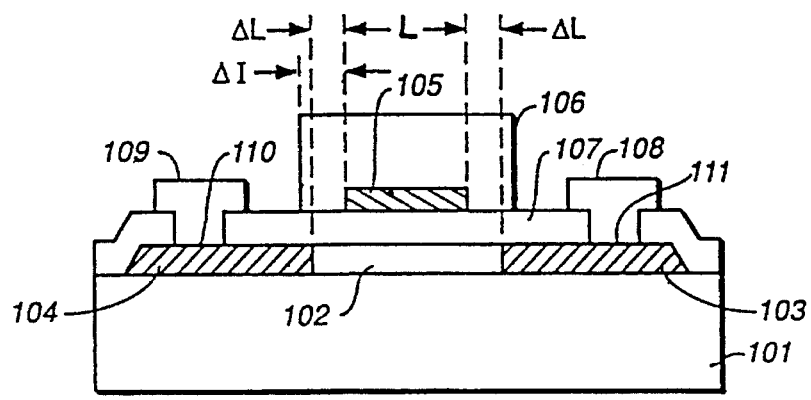
FIG._1
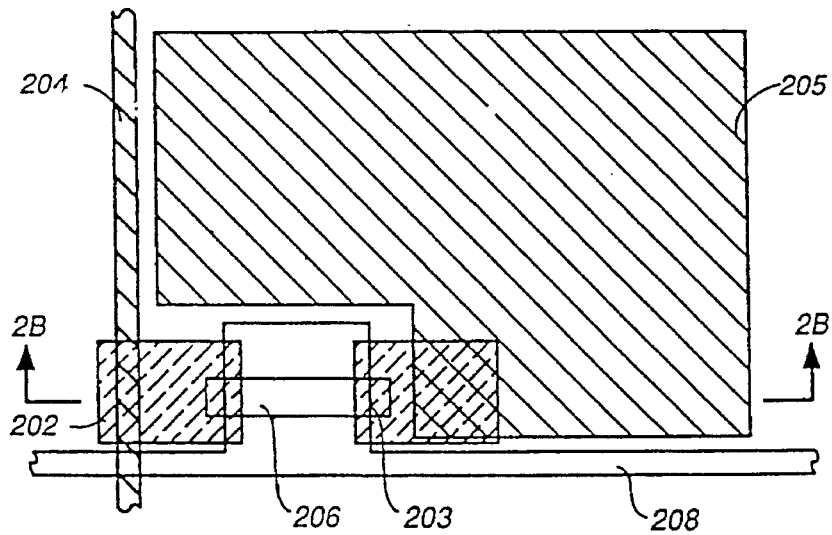
FIG._2A
(PRIOR ART)
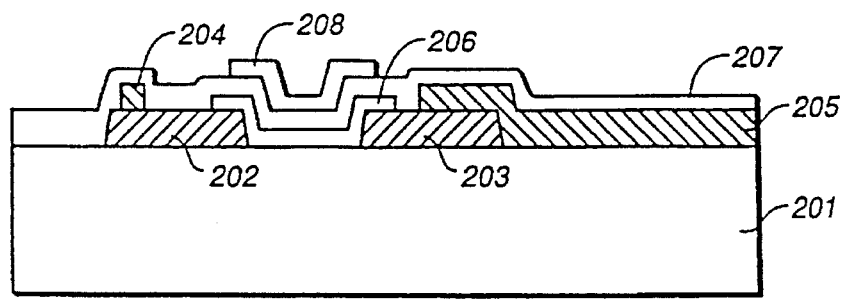
FIG._2B
(PRIOR ART)

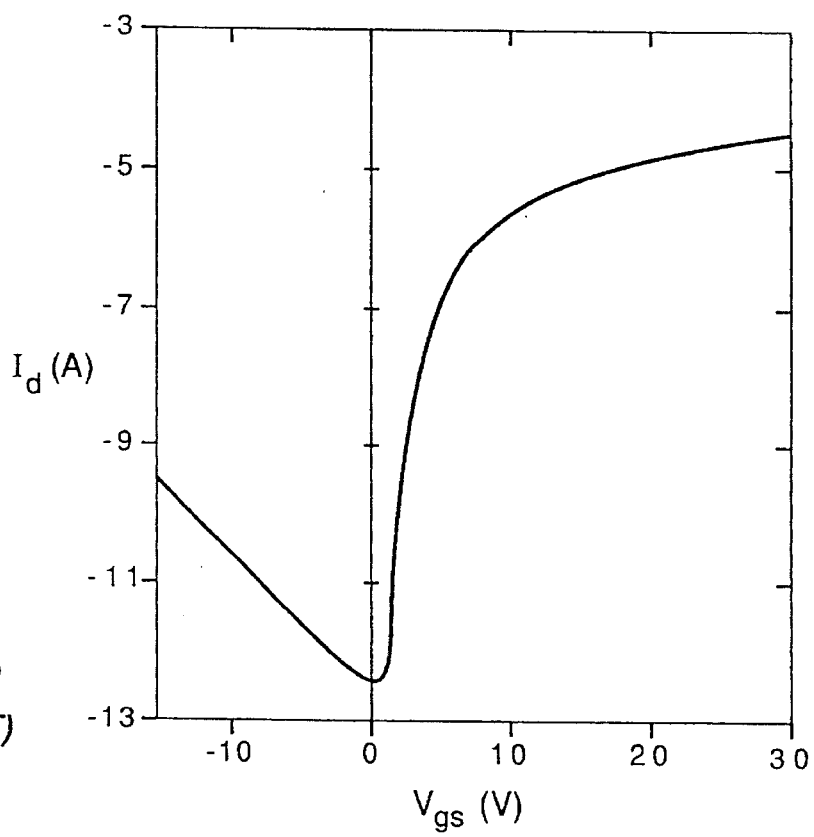
FIG._3
*(PRIOR ART)*
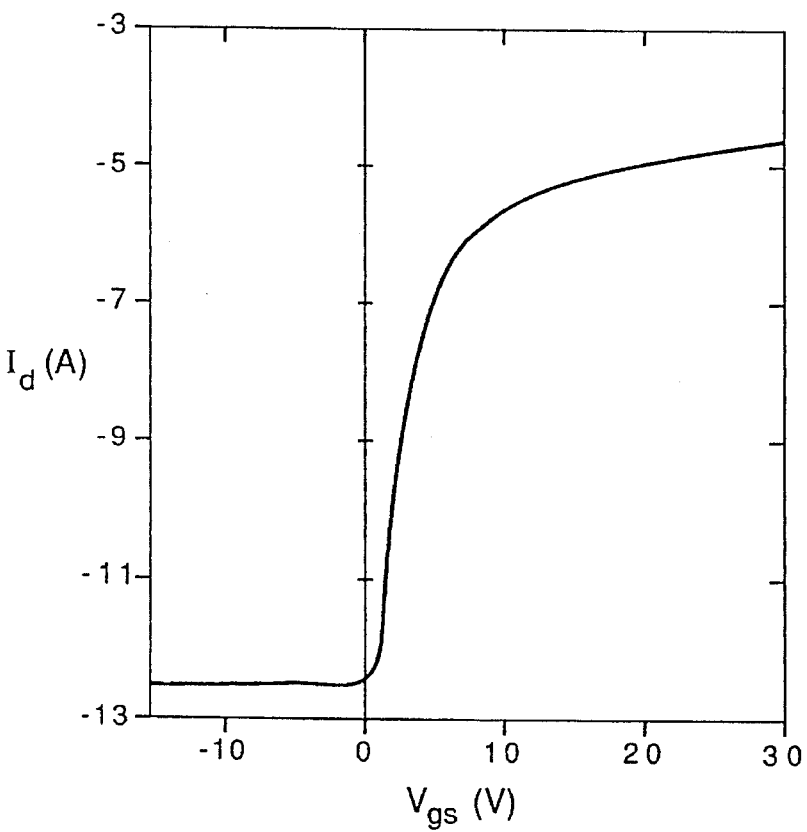
FIG._5

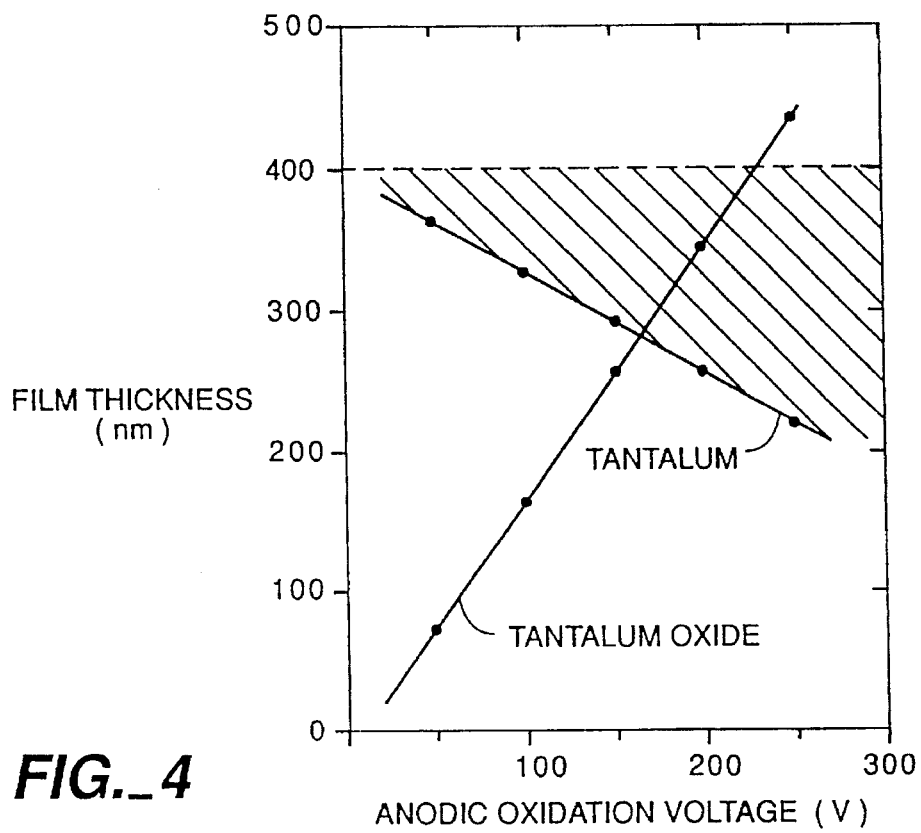
FIG._4
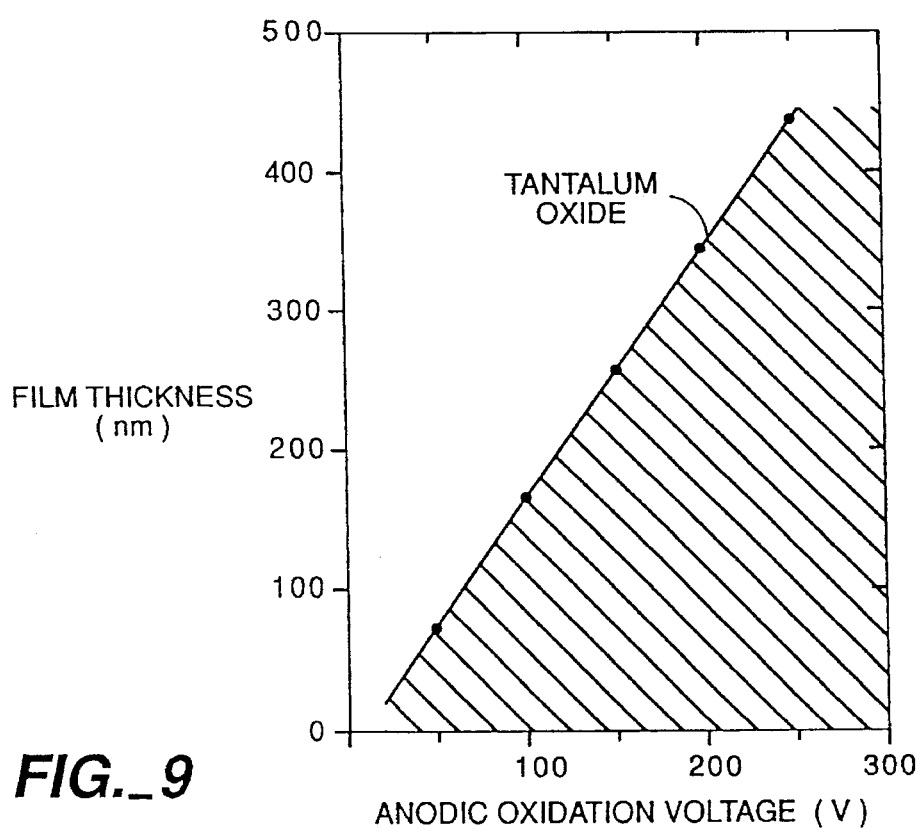
FIG._9

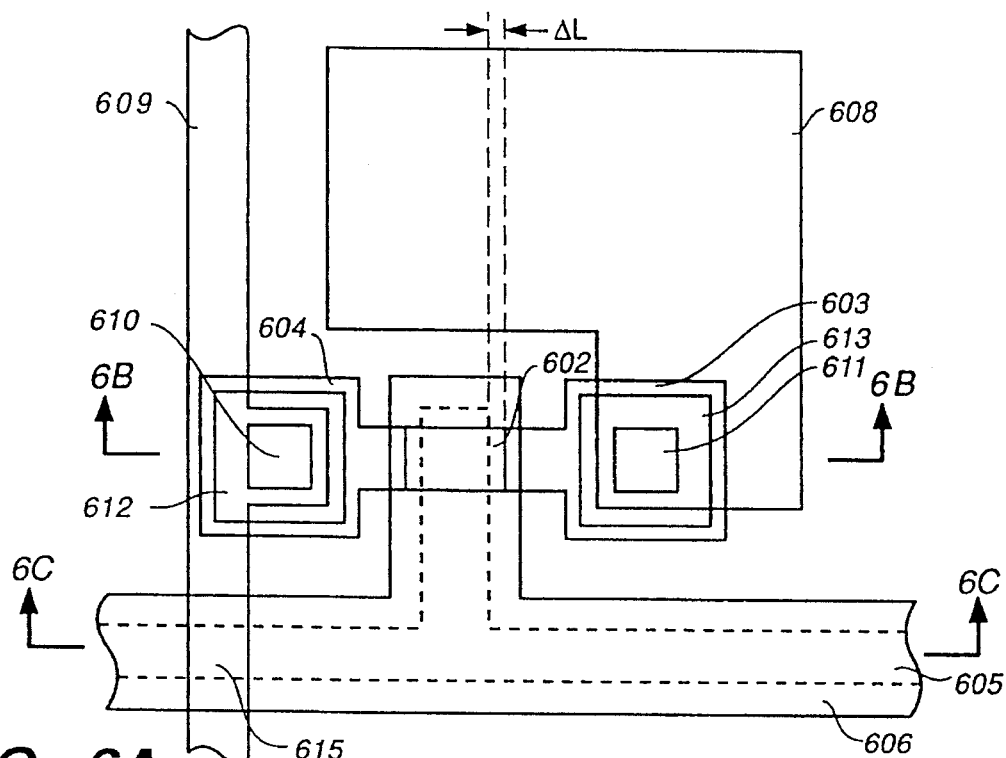
FIG._6A
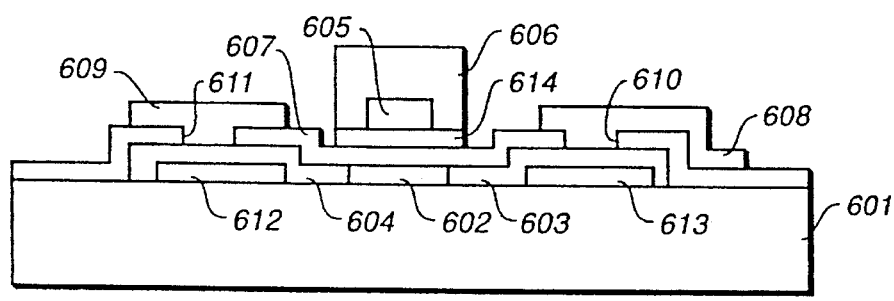
FIG._6B
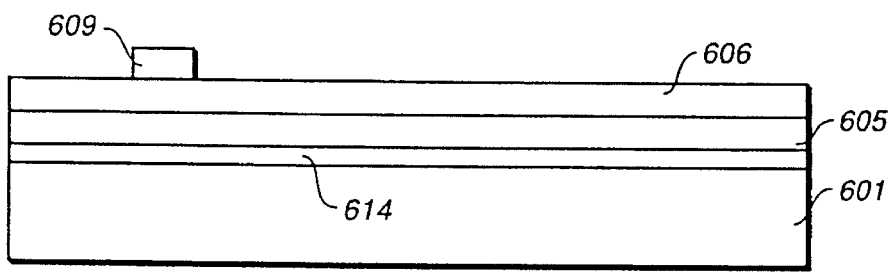
FIG._6C

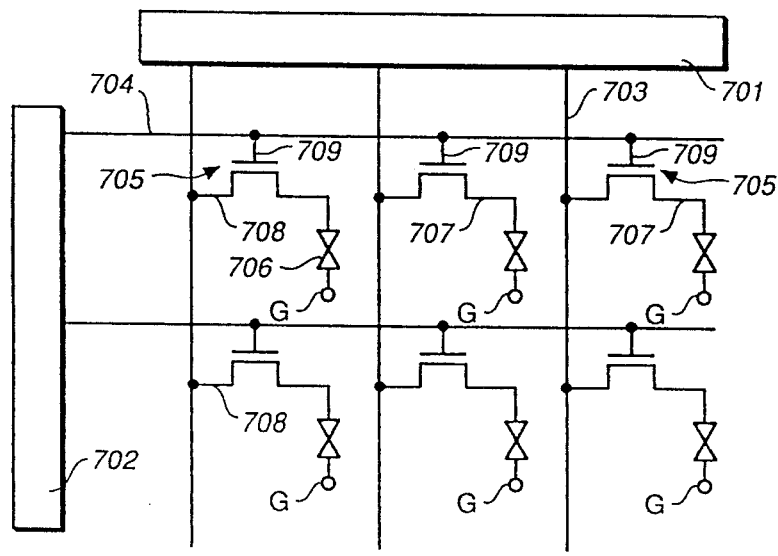
FIG._7A
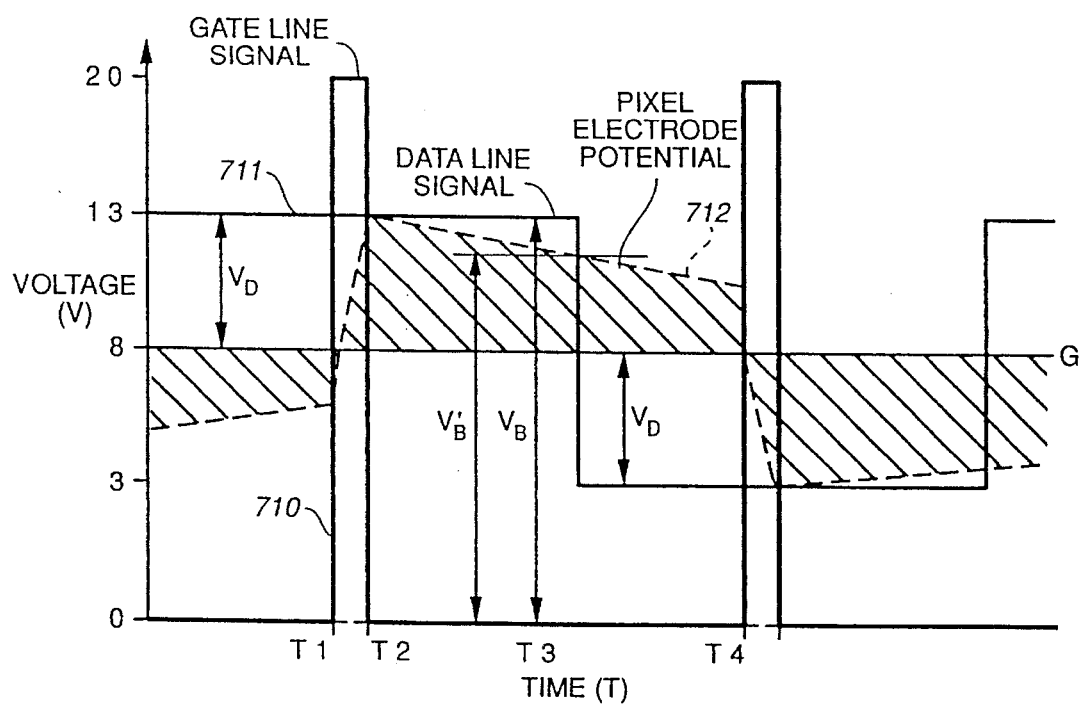
FIG._7B

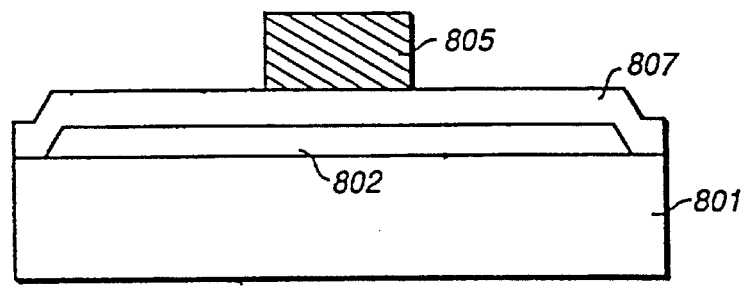
FIG._8A
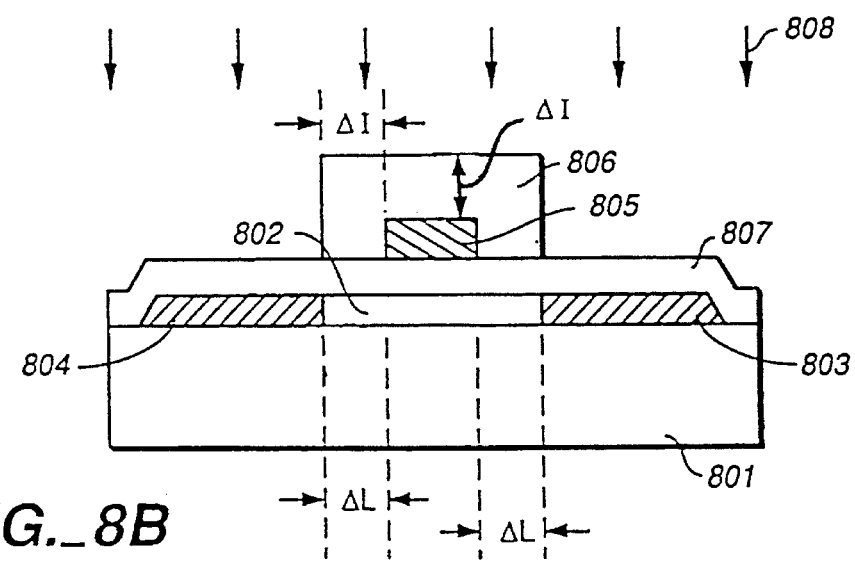
FIG._8B
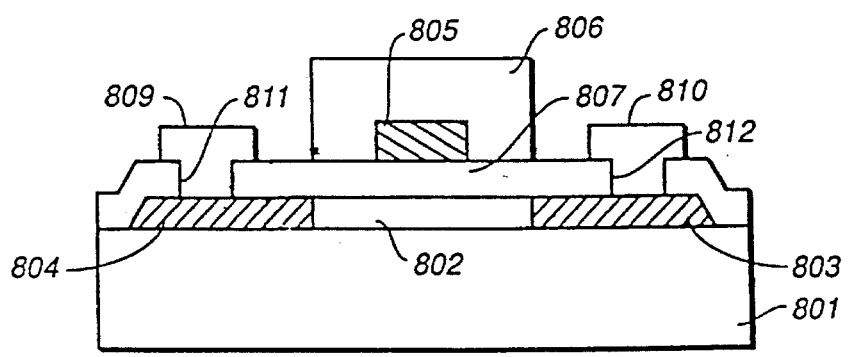
FIG._8C

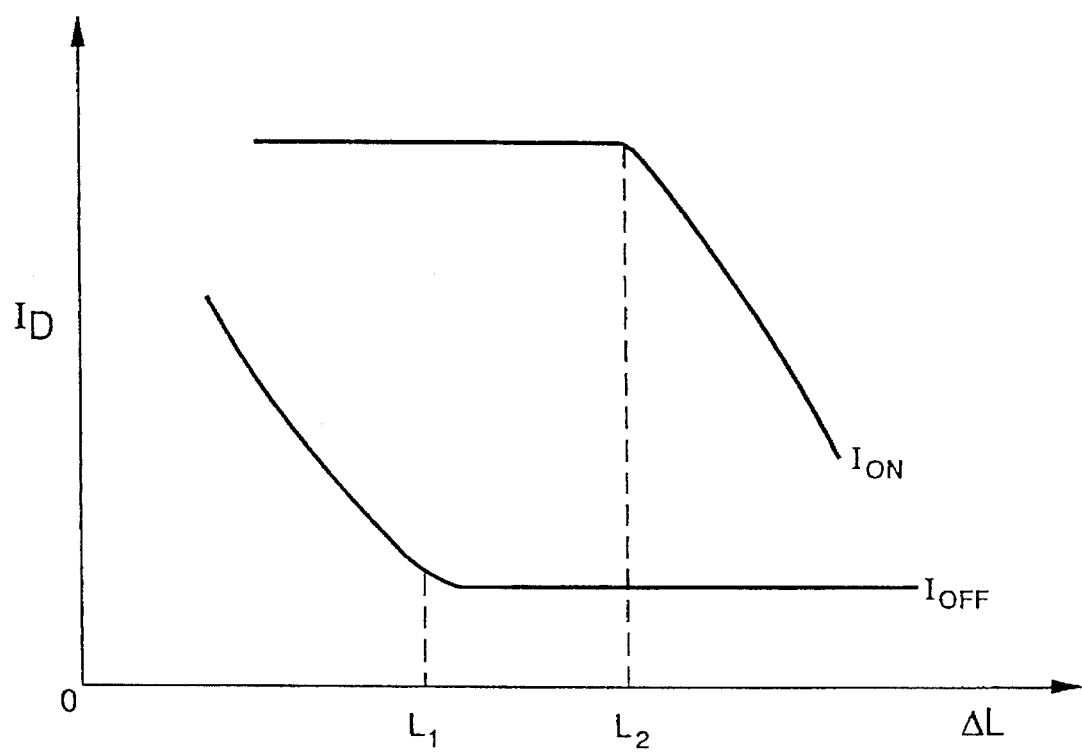
FIG._10

METHOD OF MANUFACTURING AN ACTIVE MATRIX PANEL

This is a division of U.S. patent application Ser. No. 08/378,906, filed Jan. 26, 1995, which is a file wrapper continuation of application Ser. No. 07/880,120, filed May 7, 1992, which has been expressly abandoned.

BACKGROUND OF THE INVENTION

This invention relates generally to a thin film transistor and more particularly to a thin film transistor applicable to, for example, active matrix liquid crystal displays and integrated circuit memories. Conventional thin film transistors have a structure such as illustrated, for example, in JAPAN' DISPLAY 86, pages 196–199, published in 1986 and generally illustrated in FIG. 2A, which is a plan view of the structure and FIG. 2B is a cross sectional view taken along the line B-B' of FIG. 2A. The thin film transistor comprises an insulating substrate 201, e.g., glass, quartz or sapphire, and a source region 202 and a drain region 203, which are polysilicon thin films with impurities added to these films as donors or acceptors. A data line 204 and a pixel electrode 205 are in electrical contact respectively with the source region 202 and the drain region 203. A semiconductor layer 206, comprising, for example, a polysilicon thin film, is in electrical contact with both the upper surface of the source region 202 and the upper surface the drain region 203 and also extends between these regions 202 and 203. A gate insulating film 207 overlays all these components, and a gate electrode 208 is formed on gate insulating film 207. FIG. 3 graphically illustrates the characteristics of a thin film transistor according to the structure shown in FIGS. 2A and 2B. The abscissa axis represents gate voltage, $V_{gs}$, and the ordinate axis represents the logarithm of drain electrode, $I_d$. The characteristics are for an n-type thin film transistor having a source/drain voltage of 4 V and channel length and channel width both of 10 μm. The drain current, $I_d$, when the gate voltage, $V_{gs}$, is a negative value is expressed as the OFF current, $I_{OFF}$, and the drain current, $I_d$, which flows when the gate voltage $V_{gs}$ is positive is expressed as $I_{ON}$. To be noted is that the drain current, $I_d$, is at a minimum when the gate voltage is near zero volts. At a negative gate voltage, $V_{gs}$, Hall current is produced increasing the OFF current, $I_{OFF}$, as illustrated in FIG. 3, thereby significantly reducing the $I_{ON}/I_{OFF}$ ratio. As a result, when this type of thin film transistor structure is utilized in an active matrix liquid crystal display, having a liquid crystal layer across which electrical charge is held, when the gate voltage of the transistor is decreased to zero or a negative value after electrical charges have been applied and accumulated relative to the liquid crystal layer, the continued maintenance of these accumulated electric charges, as applied, at a sufficient operating level is difficult due to an undesirably large OFF current condition resulting in overall deterioration of image quality is experienced in the liquid crystal display.

It is an object of this invention to overcome this difficulty by providing a thin film transistor that exhibits a large $I_{ON}/I_{OFF}$ ratio.

SUMMARY OF THE INVENTION

According to this invention, a thin film transistor (TFT) comprises an insulator covering the surface of the transistor gate electrode, which electrode is separated from an underlying semiconductor layer, having defined source, drain and channel regions, by a gate insulating layer. The semiconductor layer is spaced from the gate electrode by a distance equal to or less than the thickness of the overlying gate insulator. The overlying gate insulator is formed by anodic oxidation of the gate electrode metal. The formation of the gate insulator thickness and its offset, ΔL, which is defined as the lateral spatial separation between the gate electrode and the source or drain region, can be accurately controlled by the gate electrode anodic oxidation process to provide a reliable and reproducible TFT with low OFF current, $I_{OFF}$, resulting in a TFT that provides for a large $I_{ON}/I_{OFF}$ ratio useful in large area applications wherein electrical charge is required, such as, liquid crystal displays and memory integrated circuits. Preferably, the metal gate electrode is subjected to anodic oxidation at a voltage within the range of between approximately 150 V to 250 V achieving an offset, ΔL, in the range of approximately 100 nm to 200 nm.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 1 is a cross-sectional view of a thin film transistor according to first embodiment of this invention.

FIGS. 2A and 2B illustrate the structure of a conventional thin film transistor wherein FIG. 2A is a plan view of the structure and FIG. 2B is a cross-section taken along the line B-B' of FIG. 2A.

FIG. 3 is a graphic illustration of the I/V characteristics of the conventional thin film transistor.

FIG. 4 is a graphic illustration of how the film thickness of tantalum oxide varies with changes in an applied anodic oxidation voltage.

FIG. 5 is a graphic illustration of the I/V characteristics of the thin film transistor according to this invention.

FIGS. 6A, 6B and 6C illustrate an active matrix liquid crystal display substrate utilizing the thin film transistor of this invention wherein FIG. 6A is a plan view, FIG. 6B is a cross-section taken along the line B-B' of FIG. 6A, and FIG. 6C is a cross-sectional taken along the line C-C' of FIG. 6A.

FIG. 7A shows an equivalent circuit of the active matrix type liquid crystal display.

FIG. 7B shows a driving signal wave form.

FIGS. 8A, 8B and 8C are cross-sectional views of thin film transistor according to a second embodiment of this invention.

FIG. 9 is a graphic illustration of how the film thickness of tantalum oxide varies with changes in an applied anodic oxidation voltage.

FIG. 10 is a graphic illustration of the relationship between drain current, $I_D$, and values of spatial offset, ΔL.

DESCRIPTION OF THE PREFERRED EMBODIMENTS

Reference is now made to FIG. 1 which illustrates a first embodiment of a thin film transistor according to this invention comprising a sectional view along the length of the transistor channel. The thin film transistor of this embodiment comprises a semiconductor layer which is formed to include a region 102 functioning as a channel region of the thin film transistor, a region 104 functioning as a source region, and a region 103 functioning as a drain region. These regions are formed, for example, from a 25 nm thick polysilicon layer deposited on a substrate 101, e.g., of glass, quartz, ceramic or silicon. The polysilicon layer is formed by decomposing monosilane gas in an atmosphere of 600° C. employing LPCVD. The formation of the polysilicon layer is not limited to the LPCVD but polysilicon may also be formed by forming, first, an amorphous silicon layer, such as, by sputtering or plasma CVD and thereafter annealing the amorphous silicon layer at a temperature within the range of about 550° C. to 600° C. for 5 to 40 hours to covert this layer to polysilicon. Alternatively, the amorphous silicon layer may be irradiated with an argon or excimer laser to convert the layer to polysilicon.

Next, a gate insulating film 107 of $SiO_2$ is formed on the formed semiconductor layer having a thickness, for example, of 150 nm employing, for example, ECR plasma CVD. ECR plasma CVD assures formation of fine $SiO_2$ at a low temperature of 100° C. or below containing less traps. Gate insulating film 107 may be fabricated by other methods, such as, by thermally oxidizing the surface of polysilicon regions 102, 103 and 104 in an oxygen atmosphere at a temperature of 1100° C.

Next, a 400 nm thick gate electrode 105 is formed, such as, by sputtering employing a metal that is capable of oxidation, particularly by means of anodic oxidation, e.g., tantalum (Ta). This is followed by diffusion of impurities, such as, phosphorus ions, which are implanted into the polysilicon layer comprising regions 103 and 104 through gate insulating film 107 at a concentration of $3\times10^{15}$ $cm^{-2}$ and at an energy level of 120 KeV via ion implantation. In this case, the tantalum gate electrode 105 functions as a self-alignment mask thereby defining respective n-type drain and source regions 103 and 104. Alternative, impurities, such as boron ions, may be utilized as the implant impurity forming a p-type thin film transistor. A combination of n-type and p-type implanted ions may be utilized with masking via a photoresist or other such material to produce CMOS inverter circuits containing enhancement mode and depletion mode thin film transistors and the formation of memory cell circuits in a large memory array, such as, a SRAM.

The implanted phosphorus ion drain and source regions 103 and 104 may next be irradiated with an argon or excimer laser to reduce the resistance level of the polysilicon these regions.

Next, an insulator 106 of tantalum oxide is formed on the surface of Ta gate electrode 105, which may be produced from an electrolytic reaction through anodic oxidation of Ta. Through the application of anodic oxidation, the width of the originally created gate electrode structure decreases by an amount slightly greater than $2\Delta L$, shown in FIG. 1. In other words, if the length of the originally formed gate electrode is $L+2\Delta L$, then by anodic oxidation, the length is reduced to L so that the lateral offset distance formed between either drain or source region 103 and 104 and gate electrode 105 in FIG. 1 is $\Delta L$.

It should be noted that the cubic volume of $TaO_x$ is greater than Ta per se. Furthermore, the anodic growth of $TaO_x$ from the original Ta surface grows or extends in opposite directions, i.e., the oxide growth extends into the Ta bulk forming $TaO_x$ and concurrently extends beyond the original Ta surface outwardly therefrom forming $TaO_x$. Thus, in the case of the embodiment shown in FIG. 1, when gate electrode 105 is anodized after the formation of drain and source regions 103 and 104, $\Delta L$ will be smaller than the resultant lateral thickness of the overlying insulator, $\Delta l$, i.e., $\Delta l > \Delta L$.

FIG. 4 illustrates how the film thickness of tantalum oxide and of tantalum varies with changes in anodic oxidation voltage. The abscissa axis in FIG. 4 represents the applied anodic oxidation voltage, and the ordinate axis represents the thickness of the film. The film thickness of tantalum oxide increases in proportion to the applied anodic oxidation voltage. The film thickness can be controlled at a rate of 1.7 to 1.8 nm/V. When tantalum is subjected to anodic oxidation, the surface of the tantalum is oxidized and the thickness of the originally deposited Ta film is thereby decreased. As a result, the offset, $\Delta L$, is generated, as illustrated in FIG. 1, corresponding to the reduced thickness of the tantalum film, indicated by a hatched portion in FIG. 4. As an example, anodic oxidation at a voltage of 250 V generates an offset, $\Delta L$, of 200 nm. It is possible to accurately control offset, $\Delta L$, by controlling the applied anodic oxidation voltage. The upper limit of the applied anodic oxidation voltage to form tantalum oxide is governed by the highest voltage that the formed tantalum oxide can resist, which is about 250 V. Hence, the amount of offset, $\Delta L$, can be accurately controlled to be any desired value between 0 nm and 200 nm.

There is a limit to the thickness of the $TaO_x$ film that can be formed by anodic oxidation of Ta. Anodic oxidation will substantially terminate at a point wherein the electric current in the anodic process becomes substantially small, such as, $1\mu A/cm^2$. Even if the applied anodic voltage is continued after this point, there is very little $TaO_x$ film growth. The film thickness of the $TaO_x$ at this point will be approximately 450 nm, as seen in FIGS. 4 and 9 and will also correspond to the offset, $\Delta L$ in FIG. 9.

In the case where the anodic oxidation is performed at a high voltage, some regions in the formed $TaO_x$ film are produced having low resistance. As a result, pinholes are created when these regions break down due to the applied high voltage. In the case of $TaO_x$ films, the highest applied anodic voltage before detrimental levels of pinhole creation is about 250 V.

Referring again to FIG. 1, the final fabrication of the TFT device includes formation of contact holes 110 and 111 in gate insulating film 107 to drain and source regions 103 and 104, and a source interconnection 109 and a drain interconnection 108, such as, made from an alloy of aluminum and silicon, are respectively formed in contact holes 110 and 111.

In a thin film transistor formed in the manner explained above, the voltage between the gate electrode and the drain region, and the voltage between the gate electrode and the source region, when the gate voltage, $V_{gs}$, is negative, can be effectively reduced due to the presence of the offset, $\Delta L$.

FIG. 5 shows the characteristics of a thin film transistor fabricated according to this invention employing an anodic oxidation voltage of 150 V and having an offset, $\Delta L$, of approximately 100 nm. It will be recalled in connection with FIG. 3 that the drain current, $I_d$, in a conventional thin film transistor, a gate voltage near zero volts is at its lowest level and increases when the gate voltage, $V_{gs}$, is a negative value. However, in the case of the thin film transistor structure of this invention, even in the case where the gate voltage, $V_{gs}$, is reduced to a negative value, the drain current, $I_d$, remains substantially a steady state condition, i.e., there is no significant change in the value of drain current, $I_d$, for gate voltages equal to or less than zero. As a result, the OFF current, $I_{OFF}$, is significantly improved while the ON current, $I_{ON}$, is substantially the same as that achieved in a conventional thin film transistor.

Reference is made to FIG. 10 which graphically illustrates the relationship between the TFT property for ON and OFF current and the value for spatial, lateral offset, $\Delta L$. In the range of $\Delta L$ between zero and $L_1$, the OFF current characteristics decrease with increasing $\Delta L$ so that the value at $L_1$ is the lowest optimum value for $\Delta L$. The value for $L_1$ is largely affected by the activation of impurities in the source/ drain regions. For example, in the case of activation of impurities performed, such as, by thermal annealing, the value of $L_1$ has to be made large since the impurities are diffused in the semiconductor layer. On the other hand, in the case of activation of impurities performed, such as, by laser annealing, the value of $L_1$ is in the range of about 100 nm to 200 nm since the impurities have a short activation time so that diffusion of impurities into the semiconductor layer does not significantly occur.

In the range between $L_1$ and $L_2$ and, more particularly, when $\Delta L$ is equal to or greater than $L_2$, the ON current characteristics decrease because the parasitic capacitance of the source/drain regions of the TFT devices increases and reaches a point wherein it cannot be ignored relative to ON resistance characteristics of the TFT device so that the ON current decreases as shown in FIG. 10 above $L_2$ so that the value at $L_2$ is the highest optimum value for $\Delta L$. Thus, the value for $\Delta L$ should be maintained between $L_1$ and $L_2$ and are determined by the properties of the TFT device, and their values cannot be unconditionally specified, but, roughly speaking, $L_1$ may be about 100 nm and $L_2$ may about 1 μm.

Since the polysilicon film of the thin film transistor of this invention forms a channel portion that is as thin as 25 nm, the range of the depletion layer is limited so that the formation of an inversion layer in the channel is easily achieved. Hence, when offset, $\Delta L$, is 200 nm or less, a reduction in the ON current, $I_{ON}$, is less. When offset, $\Delta L$, is 100 nm or less, the OFF current, $I_{OFF}$, cannot be significantly reduced since the voltage between the gate electrode and the drain region as well as between the gate electrode and the source region are not being sufficiently reduced. Therefore, the optimum value of offset, $\Delta L$, is between approximately 100 nm and 200 nm, and the optimum anodic oxidation voltage is between approximately 150 volts and 250 volts. Therefore, application of the thin film transistor according to this invention to active matrix type liquid crystal displays provides a significant advantage since the employment of anodic oxidation assures excellent reproducibility and uniformity in the achieved electrical characteristics of the thin film transistors in the display circuitry and uniform oxidation over a large area application.

In the foregoing embodiment, the gate electrode structure comprises tantalum. However, the metal utilized for the gate electrode may be of any metal capable of forming an oxide of the metal utilizing anodic oxidation, such as, aluminum or niobium.

FIG. 6 shows another embodiment of a thin film transistor according to this invention which is illustrated as applied to an active matrix liquid crystal display. FIG. 6A is a plan view of the active matrix liquid crystal display substrate and formed components. FIG. 6B is a section of a thin film transistor portion taken along the line B-B' of FIG. 6A. FIG. 6C is a section taken along the line C-C' of FIG. 6A. Silicon thin film regions 612 and 613, having a preferred thickness between approximately 50 nm and 200 nm, are formed on a glass substrate 601, e.g., NA-35 glass manufactured by Hoya Corporation, via deposition of an amorphous silicon thin layer formed by plasma. CVD or polysilicon thin layer formed by LPCVD.

Next, a semiconductor layer, having a preferred thickness between approximately 20 nm and 50 nm, is formed, in the same manner as in the case of the first embodiment, to function as a channel region 602, a source region 604 and a drain region 603 for the thin film transistor. Then, a gate insulating film 607 of $SiO_2$ is formed in contact with these layers.

After the formation of the semiconductor layer, a first insulator 614 of tantalum oxide and a gate electrode 605 of tantalum are formed. The first insulating film 614 is formed at an atmosphere of argon gas or a mixture gas of argon gas and oxygen gas employing tantalum oxide targets by RF sputtering. The thickness of first insulating film 614 is within the range of about 20 nm to 50 nm. Subsequently, gate electrode 605 is formed such as by DC sputtering having a thickness, for example, of 400 nm.

First insulator 614 and gate electrode 605 are selectively formed employing photolithography or dry etching. In the case of dry etching to form gate electrode 605 and first insulator 614, the etching apparatus comprises a plasma chamber in which a mixture of Freon and oxygen gas is decomposed by plasma discharge to generate radicals which contribute to and enhance the etching process, and an etching chamber wherein etching is conducted employing the developed plasma radicals generated in the plasma chamber and conveyed to the etching chamber. The etching rate of tantalum and that of tantalum oxide are substantially the same, and etch rate of $SiO_2$ is $1/20^{th}$ or less of the etching rate for tantalum oxide. Employing this dry etching technique, etching is continuously applied to the tantalum gate electrode 605 and to the tantalum oxide first insulator 614 until gate insulating film 607 has been completely exposed. As a result, only the portion of first insulator 614 located beneath gate electrode 605 remains and this remaining portion improves adhesion quality between gate insulating film 607 and gate electrode 605 thereby improving the reliability in successful fabrication of these thin film transistor structures.

Next, phosphorus ions are implanted into regions 603, 604, 612 and 613 through gate insulating film 607 via ion implantation to form the source and drain regions in a self-alignment manner, i.e., gate electrode 605 functioning as a mask. This is followed by the formation of a 420 nm thick second insulator 606 of tantalum oxide on gate electrode 605 by means of subjecting the surface of gate electrode 605 to anodic oxidation in a solution of 0.01 wt % of citric acid at an anodic oxidation voltage, for example, of 250 V. As a result, an offset, $\Delta L$, of approximately 200 nm is produced.

Next, phosphorus ions are irradiated by means of a laser, as in the case of the first embodiment, and thereby activated. Thereafter, etching is conducted on the gate insulating film 607 using a mixture liquid of hydrofluoric acid and ammonium fluoride to selectively etch contact holes 610 and 611. This is followed by the formation of pixel electrodes 608 of ITO having a thickness between approximately 30 nm to 50 nm, which pixels are formed relative to contact openings 610. Finally, a data line 609 comprising an alloy of aluminum and silicon is formed relative to contact holes 611.

In the active matrix substrate arranged in accordance with the foregoing description, insulation of data line 609 from electrode 605 at cross point 615 as well as the insulator 606 over gate electrode 605 comprising, for example, a 420 nm thick tantalum oxide film can be concurrently formed by the anodic oxidation treatment. Thus, a special insulating film is not needed for this purpose, as the cross point insulating requirement can be satisfied employing the same anodic oxidation treatment as in the case of forming insulator 606.

It has been found that short circuit defects between data line 609 and the electrode 605 are significantly reduced by the employment of tantalum oxide formed by anodic oxidation because this process produces a fine grain oxide that is substantially free of defects, such pin holes, which significantly contribute to the occurrence of short circuiting problems.

When a voltage is applied to a tantalum oxide film, a Poole-Frenkel conduction current flows in the tantalum oxide film, and tantalum oxide exhibits nonlinear current-voltage characteristics with a high threshold voltage. However, for comparatively thick films of tantalum oxide, such as, 420 nm, the threshold voltage is of a high level, such as, 200 V, compared with the voltage levels at for driving the active matrix substrate, e.g., 20 to 30 V and, further, the resistance level of the film is also high, e.g., $10^{15}$ Ω. As a result, the reliability of the tantalum oxide as a nonlinear device will not provide a problem relative to malfunctioning because of the high resistance level and threshold voltage of operation. When offset, $\Delta L$, is reduced to about 100 nm, the thickness of the tantalum oxide must also be reduced to about 250 nm, which is about a 30% reduction.

However, the resistance level and threshold voltage level are still sufficiently high so that there is no problem of malfunction.

As shown in FIG. 6B, since gate insulating film 607 and first insulator 614 are present between gate electrode 605 and semiconductor layer 602, the electrical characteristics of the thin film transistor are not adversely affected since the dielectric constant of tantalum oxide is large, e.g., between 25 and 28. Thus, this dual insulating layer structure reduces the potential for short circuit defects occurring between gate electrode 605 and semiconductor layer 602.

FIG. 7A illustrates an equivalent circuit of the active matrix liquid crystal display of FIG. 6A. FIG. 7B shows a drive signal waveform applied to the active matrix liquid crystal display. Actual examples of voltages are illustrated in FIG. 7B for purposes of exemplification so that it should be understood that these volatges values are only one representation of possible applied voltages.

In FIG. 7A, there is the conventional data signal circuit 701 and scanning circuit 702. Thin film transistor 705 is provided at a cross-point where data line 703, connected to the transistor source region 708, crosses a scanning line connected to the transistor gate electrode 709. A liquid crystal layer 706 is provided between a drain region 707 and a common electrode, G.

As shown in FIG. 7B, a gate signal 710 is applied to gate electrode 709 to turn on thin film transistor 705 in a time period between $T_1$ and $T_2$ to write a data signal 711 from data line 703 into liquid crystal layer 706. In a time period between $T_2$ and $T_4$, which is the retention time for the write charge on the liquid crystal layer representing a pixel, thin film transistor 705 is turned off to hold and maintain the electric charge written into liquid crystal layer 706. However, during this time period, the voltage at drain region 707 changes, as indicated by dotted line 712, and an effective voltage at the pixel, which is indicated by the cross-hatched region in FIG. 7B, is continually decreasing in value due to current leakage. Thus, the average potential during the retention time is $V_B'$.

At about time, $T_3$, a negative bias corresponding to $V_B$, relative to the potential value on data line 703, is applied to gate electrode 709.

If twist nematic liquid crystal is employed for liquid crystal layer 706, a voltage of about 1 V to 5 V for $V_D$ is necessary. This reduces $V_B$ to 10 to 12 V and the gate voltage, $V_{gs}$, to $-10$ V to $-12$ V. As a result, a sufficiently low OFF current, $I_{OFF}$, is desired, as exemplified relative to FIG. 3, which is around zero volts rather than a negative gate voltage. In contrast, the thin film transistor according to this invention provides a sufficiently low OFF current, $I_{OFF}$, as illustrated in FIG. 5, for values at zero volts and below and therefore, can easily hold and maintain the electric charge written to liquid crystal layer 706 during the desired retention time. Further, TFT properties can vary over a plurality of such TFT devices so that the lowest OFF current value is not uniformly going to be the same value. In any case, the value is always lower than the voltage, $V_D$, on the lower side. Thus, a liquid crystal display having improved overall retention time properties due to the insured application of the lowest OFF current value, meaning the lowest leakage current during retention time resulting in higher average potential, $V_B'$, achieved during the retention time, which means overall improved high contrast and excellent visual angle by utilizing the thin film transistor of this invention.

FIG. 8 illustrates another embodiment of a thin film transistor according to this invention. As shown in FIG. 8A, a semiconductor layer 802 of polysilicon, a gate insulating film 807 of $SiO_2$ and a gate electrode 805 comprising tantalum are sequentially formed on a substrate 801, in the same manner as explained in connection with the first embodiment of FIG. 1. However, in this embodiment, drain and source regions 803 and 804 are formed after the anodic oxidation of originally formed gate electrode 805. As shown in FIG. 8B, the next step is that the surface of gate electrode 805 is subjected to oxidation by anodic oxidation to form insulator portion 806 of tantalum oxide. The thickness of the insulator portion 806 in the lateral direction (ie, $\Delta I$) is equal to the thickness of the insulator portion 806 atop the gate electrode, as clearly shown in FIG. 8B. This is followed by ion implantation or high-energy ion doping of phosphorus ions 808 into semiconductor layer 802 through gate insulating film 807 to form source region 804 and drain region 803 in a self-alignment manner wherein tantalum oxide insulator 805 functions as a mask. It is to be noted that in conjunction with this embodiment, as compared to the embodiment of FIG. 1, since impurities are implanted in regions 803 and 804 after anodic oxidation of gate electrode 805, the spatial offset, $\Delta L$, between resultant gate electrode 805 and either region 803 and 804 is substantially equal to the lateral thickness of the overlying insulator, $\Delta I$, i.e., $\Delta I \approx \Delta L$.

Next, the implanted phosphorus ions are irradiated by an argon or excimer laser or activated by ramp annealing so as to reduce the resistance of polysilicon which forms source region 804 and drain region 803. It is desirable that activation be conducted over a short time. Activation which requires a long period of time, such as, by conventional heat annealing, diffuses the implanted phosphorus ions into semiconductor layer 802 and thereby effectively reducing the offset, $\Delta L$.

Lastly, contact holes 811 and 812 to source region 804 and drain region 803 are formed, and source and drain electrodes or interconnections 809 and 810 are thereafter formed.

Thus, relative to the embodiments of the TFT structure of this invention, the diffused regions of the TFT devices can be defined as laterally offset from the resultant gate electrode by a distance equal to or less than the lateral thickness of the overlying gate insulator, i.e., $\Delta I \geq \Delta L$.

FIG. 9 illustrates the relation between the anodic oxidation voltage as applied to the tantalum film and the film thickness of tantalum oxide wherein the abscissa axis represents the anodic oxidation voltage and ordinate axis represents the film thickness. To be noted is that the film thickness of tantalum oxide increases in proportion to the anodic oxidation voltage so that the film thickness can be controlled at a rate of 1.7 nm/V to 1.8 nm/V.

As a result, an offset, ΔL, is created, as illustrated in FIG. 8B, corresponding to the film thickness indicated by a cross-hatched area in FIG. 9. Offset, ΔL, can be accurately controlled, therefore, in a range from approximately 0 nm to 450 nm by controlling the applied anodic oxidation voltage.

In the first embodiment, anodic oxidation is conducted after implantation of impurity ions, and the offset, ΔL, can be accurately controlled in a range between approximately 0 nm to 200 nm. However, in this second embodiment, the order at which the ion implantation process and the anodic oxidation process are conducted is reversed, and, as a result, the offset, ΔL, can be controlled over a larger range than compared to the first embodiment. Therefore, when compared with the first embodiment, the voltage between the gate electrode and the drain region and between the gate electrode and the source region, when the gate voltage, $V_{gs}$, is reduced to a negative value, can be further reduced, thus further increasing the source drain voltage, $V_{ds}$, and thereby further reducing the OFF current, $I_{OFF}$, when the gate voltage, $V_{gs}$ is negative. Hence, the thin film transistor according to this invention can be applied to active matrix type displays of EL (Electroluminescent) type or PDLC (Polymer Dispersed Liquid Crystal) type which require higher drive voltages, compared to drive voltages required, for example, for a TN (Twisted Nematic) type liquid crystal medium.

In summary, the thin film transistor structure of this invention provides for the following several advantages. First, since anodic oxidation allows for accurate control of the offset, ΔL, over a large area of treatment, a thin film transistor having a sufficiently low OFF current, $I_{OFF}$, can be provided with high continuous reliability and reproducibility.

Second, application of the thin film transistor of this invention to an active matrix display of EL type or PDLC type requiring high drive voltages provides a planar thin display with excellent display quality.

Third, application of the thin film transistor according to this invention to an active matrix type liquid crystal display greatly reduces the possibilities of short circuit defects thereby providing a liquid crystal display having an excellent display quality.

Fourth, since a simple process of anodic oxidation allows for accurate control of the offset, ΔL, the apparatus utilized in this oxidation processing is not costly, thereby decreasing production cost of the liquid crystal display. While the invention has been described in conjunction with several specific embodiments, it is evident to those skilled in the art that many further alternatives, modifications and variations will be apparent in light of the forgoing description. Thus, the invention described herein is intended to embrace all such alternatives, modifications, applications and variations as may fall within the spirit and scope of the appended claims.

What is claimed is:

1. A method of manufacturing an active matrix panel in which data signals are supplied to liquid crystal layers through a plurality of thin film transistors arranged in a matrix of pixels, gate lines and data lines being coupled to each thin film transistor, said method comprising the steps of:

forming a semiconductor layer on a substrate;

forming a gate insulating film on said semiconductor layer;

forming a gate electrode above said gate insulating film and a gate line in electrical contact with said gate electrode;

forming a source region and a drain region in said semiconductor layer by adding impurities thereto as donors or acceptors using said gate electrode as a self alignment mask;

simultaneously forming an overlying gate insulator on a top and sidewalls of said gate electrode and said gate line by anodic oxidation of said gate electrode and said gate line to reduce the dimensions of said gate electrode and said gate line and simultaneously form a lateral offset, ΔL, from said source region and said drain region to the sidewalls of said gate electrode; and forming a data line in electrical contact with said source region and crossing over said gate line at a cross-over location, wherein said overlying gate insulator is located between said data line and said gate line at said cross-over location to insulate said data line from said gate line.

2. The method of claim 1 wherein said gate electrode is comprised of tantalum, and wherein said overlying gate insulator comprises tantalum oxide.

3. The method of claim 1 wherein said gate electrode is selected from the group consisting of tantalum, aluminum and niobium.

4. The method of claim 1 wherein said gate electrode is subjected to anodic oxidation at a voltage within the range of between 150 V to 250 V, achieving the lateral offset, ΔL, in a range of 100 nm to 200 nm.

5. The method of claim 1 wherein the gate insulating film is formed by thermally oxidizing a surface of the semiconductor layer.

6. The method of claim 1 wherein the semiconductor layer is a polysilicon layer formed by decomposing monosilane gas in a temperature of 600° C. using LPCVD.

7. The method of claim 1 wherein the semiconductor layer is a polysilicon layer formed by first forming an amorphous silicon layer and annealing the amorphous silicon layer at a temperature within a range of 550° C. to 600° C. for 5 to 40 hours.

8. The method of claim 1 wherein the gate insulating film is formed on a surface of the semiconductor layer by ECR plasma CVD at a temperature of 100° C. or less.

9. The method of claim 1 wherein the source region and the drain region are formed by implanting phosphorous ions into the semiconductor layer through the gate insulating film.

10. The method of claim 9 wherein the implanted phosphorous ions are radiated with a laser to reduce the resistance level in the semiconductor layer.

11. The method as defined in claim 1 wherein the overlying gate insulator is formed having a lateral thickness, ΔI, which is greater than the lateral offset, ΔL.

12. The method as defined in claim 1 wherein the step of forming the overlying gate insulator by anodic oxidation decreases the width of the gate electrode by about twice the lateral offset, ΔL.

13. A method of manufacturing an active matrix panel in which data signals are supplied to liquid crystal layers through a plurality of thin film transistors arranged in a matrix of pixels, gate lines and data lines being coupled to each thin film transistor, said method comprising the steps of:

forming a first silicon thin film region and a second silicon thin film region on a surface of a substrate;

forming a semiconductor layer on the surface of the substrate between said first and second thin film regions;

forming a gate insulating film on a surface of said semiconductor layer;

forming a gate electrode above said gate insulating film and a gate line in electrical contact with said gate electrode;

implanting ions into said first and second thin film regions and said semiconductor layer through said gate insulating film using said gate electrode as a self-alignment mask to form a source region and a drain region;

simultaneously subjecting a surface of said gate electrode and said gate line to anodic oxidation to reduce the dimensions of said gate electrode and said gate line to form an overlying gate insulator on a top and sidewalls of said gate electrode and said gate line which simultaneously forms a lateral offset, $\Delta L$, from said source region and said drain region to the sidewalls of said gate electrode; and forming a data line in electrical contact with said source region and crossing over said gate line at a cross-over location, wherein said overlying gate insulator is located between said data line and said gate line at said cross-over location to insulate said data line from said gate line.

14. The method of claim 13 wherein the gate electrode is selected from the group consisting of tantalum, aluminum and niobium.

15. The method of claim 13 wherein the gate insulating film is formed by thermally oxidizing the surface of the semiconductor layer.

16. The method of claim 13 wherein the semiconductor layer is a polysilicon layer formed by first forming an amorphous silicon layer and irradiating the amorphous silicon layer with a laser.

17. The method as defined in claim 13 wherein the overlying gate insulator is formed having a lateral thickness, $\Delta I$, which is greater than the lateral offset, $\Delta L$.

18. The method as defined in claim 13 wherein the step of forming the overlying gate insulator by anodic oxidation decreases the width of the gate electrode by about twice the lateral offset, $\Delta L$.

19. The method of claim 13 further comprising the step of forming a first insulating film on a surface of the gate insulating film with said gate electrode formed on a surface of the first insulating film.

* * * * *